(12) United States Patent
Rho et al.

(10) Patent No.: US 8,953,375 B2
(45) Date of Patent: Feb. 10, 2015

(54) SEMICONDUCTOR MEMORY DEVICE AND OPERATION METHOD THEREOF

(75) Inventors: Jun-Rye Rho, Gyeonggi-do (KR); Seok-Hwan Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 349 days.

(21) Appl. No.: 13/591,941

(22) Filed: Aug. 22, 2012

(65) Prior Publication Data

US 2013/0170295 A1 Jul. 4, 2013

(30) Foreign Application Priority Data

Dec. 29, 2011 (KR) ........................ 10-2011-0146089

(51) Int. Cl.
*G11C 16/06* (2006.01)

(52) U.S. Cl.
USPC ............... 365/185.09; 365/185.03; 365/185.2

(58) Field of Classification Search
CPC ........... G11C 16/3427; G11C 11/5621; G11C 2211/5641
USPC ............................. 365/185.09, 185.03, 185.2
See application file for complete search history.

(56) References Cited

U.S. PATENT DOCUMENTS

| | | | | |
|---|---|---|---|---|
| 8,000,135 B1 * | 8/2011 | Perlmutter et al. | ...... | 365/185.03 |
| 8,203,879 B2 * | 6/2012 | Chang et al. | ............ | 365/185.03 |
| 8,837,215 B2 * | 9/2014 | Lee | ............ | 365/185.03 |
| 2002/0001230 A1 * | 1/2002 | Fukuoka | ................. | 365/185.26 |
| 2006/0268608 A1 * | 11/2006 | Noguchi et al. | ......... | 365/185.09 |
| 2008/0192544 A1 * | 8/2008 | Berman et al. | ........... | 365/185.09 |
| 2010/0157671 A1 * | 6/2010 | Mokhlesi | ................. | 365/185.03 |
| 2010/0202196 A1 * | 8/2010 | Lee et al. | ................. | 365/185.02 |
| 2011/0026353 A1 * | 2/2011 | Mokhlesi | ...................... | 365/222 |
| 2011/0069545 A1 * | 3/2011 | Futatsuyama et al. | ... | 365/185.03 |
| 2011/0075478 A1 * | 3/2011 | Yoon et al. | ............... | 365/185.03 |
| 2013/0070525 A1 * | 3/2013 | Shimura | .................. | 365/185.03 |
| 2013/0194883 A1 * | 8/2013 | Lee, Chul-Ho | ............... | 365/201 |
| 2014/0198569 A1 * | 7/2014 | Kim et al. | ................ | 365/185.03 |
| 2014/0269054 A1 * | 9/2014 | Wu et al. | .................. | 365/185.03 |

FOREIGN PATENT DOCUMENTS

KR 1020090066732 6/2009

* cited by examiner

*Primary Examiner* — Tuan T Nguyen
(74) *Attorney, Agent, or Firm* — IP & T Group LLP

(57) ABSTRACT

A semiconductor memory device includes an information generation unit configured to convert positions of threshold voltages of memory cells in threshold voltage distributions based on determination voltages included in an overlapping portion between the threshold voltage distributions to generate a plurality of position information codes, and an error correction unit configured to sequentially receive the plurality of position information codes and perform an error correction operation for data of the memory cells.

11 Claims, 4 Drawing Sheets

SEMICONDUCTOR MEMORY DEVICE AND OPERATION METHOD THEREOF

CROSS-REFERENCE TO RELATED APPLICATIONS

The present application claims priority of Korean Patent Application No. 10-2011-0146089, filed on Dec. 29, 2011, which is incorporated herein by reference in its entirety.

BACKGROUND

1. Field

Exemplary embodiments of the present invention relate to semiconductor design technology, and more particularly, to a semiconductor memory device which divides a plurality of threshold voltage distributions using determination voltages.

2. Description of the Related Art

In general, semiconductor memory devices are divided into volatile memory devices such as DRAM (Dynamic Random Access Memory) and SRAM (Static Random Access Memory) and nonvolatile memory devices such as PROM (Programmable Read Only Memory), EPROM (Erasable PROM), EEPROM (Electrically EPROM), and a flash memory device. The division between the volatile memory devices and the nonvolatile memory devices mainly depends on whether or not data stored in a memory cell is maintained after a given time.

In other words, the volatile memory device may not maintain data stored in a memory cell thereof after a given time, but the nonvolatile memory device maintains data stored in a memory cell thereof even after a given time. Therefore, the volatile memory device is to perform a refresh operation to maintain data, and the volatile memory device operates without such a refresh operation. Since the characteristic of the nonvolatile memory device is suitable for low power and high integration, the nonvolatile memory device is widely used as a storage medium of portable devices.

Meanwhile, the flash memory device among the nonvolatile memory devices stores data in memory cells through a programming operation and an erasing operation. Here, the programming operation refers to an operation of storing electrons in a floating gate of a transistor forming a memory cell, and the erasing operation refers to an operation of discharging the electrons stored in the floating gate of the transistor to a substrate. The flash memory device stores data of '0' or '1' in the memory cell through such an operation. Furthermore, during a reading operation, the flash memory device senses the quantity of electrons stored in the floating gate and determines whether the data stored in the memory cell is '0' or '1' depending on the sensing result.

As described above, data of '0' or '1' may be stored in one memory cell. That is, one bit data is stored in one memory cell, and the memory cell is referred to as a single level cell. A method of storing one or more-bit data in one memory cell has been adopted, and the memory cell is referred to as a multi-level cell. While the single level cell uses a single threshold voltage as one determination voltage to determine whether the data stored therein is '0' or '1', the multi-level cell uses, for example, three or more determination voltages to determine whether the data stored therein is '00', '01', '10', or '11'.

Meanwhile, a memory cell of the flash memory device has a threshold voltage in a given voltage distribution depending on the corresponding data stored therein. However, voltage distributions for multi-bit data, e.g., '00', '01', '10', or '11', may overlap each other. In this case, data outputted by a determination voltage during a read operation may differ from data which is actually stored. Therefore, the flash memory device provides various methods for correcting such an error. The methods may include a method using an error correction code (ECC). The ECC is an additional code inputted with data. The flash memory device detects and corrects error data through an error correction operation using the ECC.

With the technology development, the voltage distributions have been narrowed. However, a distance between adjacent voltage distributions has also been reduced for operations based on low power consumption. When the distance between the adjacent voltage distributions is reduced, it means that an overlapping portion between the adjacent voltage distributions increases. This means that it is highly likely that an error occurs when data are outputted. Since the number of data to be corrected by an error correction operation is limited, a method capable of utilizing an ECC is being developed.

SUMMARY

An exemplary embodiment of the present invention is directed to a semiconductor memory device which converts positions of threshold voltages in a given voltage distribution into a plurality of position information codes and performs an error correction operation using the position information codes.

In accordance with an exemplary embodiment of the present invention, a semiconductor memory device includes an information generation unit configured to convert positions of threshold voltages of memory cells in threshold voltage distributions based on determination voltages included in an overlapping portion between the threshold voltage distributions to generate a plurality of position information codes; and an error correction unit configured to sequentially receive the plurality of position information codes and perform an error correction operation for data of the memory cells.

In accordance with another exemplary embodiment of the present invention, a semiconductor memory system includes a memory unit configured to convert positions of threshold voltages of memory cells in threshold voltage distributions into a plurality of position information codes in response to determination voltages included in an overlapping portion between the threshold voltage distributions and sequentially output the plurality of position information codes in response to a read command, an error correction unit configured to perform an error correction operation on the plurality of position information codes for data of the memory cells, and a control unit configured to generate the read command in response to an output signal of the error correction unit.

In accordance with yet another exemplary embodiment of the present invention, an operating method of a semiconductor memory device includes setting a plurality of determination voltages in an overlapping portion between threshold voltage distributions; converting a position of a threshold voltage of a memory cell in the threshold voltage distributions into a plurality of position information codes based on the plurality of determination voltages, performing an error correction operation on one position information code among the plurality of position information codes, in response to a read command, and detecting whether data of the memory cell is normal or not, depending on a result from the performing of the error correction operation.

In accordance with still another exemplary embodiment of the present invention, an operating method of a semiconductor memory device includes setting first to third determination voltages in an overlapping portion between threshold voltage distributions, wherein the first to third determination voltages are in order from the lowest to the highest, determining a position of a threshold voltage of a memory cell in the threshold voltage distributions based on the second determination voltage to generate a first position information code, determining the position of the threshold voltage based on the first and third determination voltages to generate a second position information code; and sequentially receiving the first and second position information codes to perform an error correction operation for data of the memory cell.

DETAILED DESCRIPTION

Figure 1:
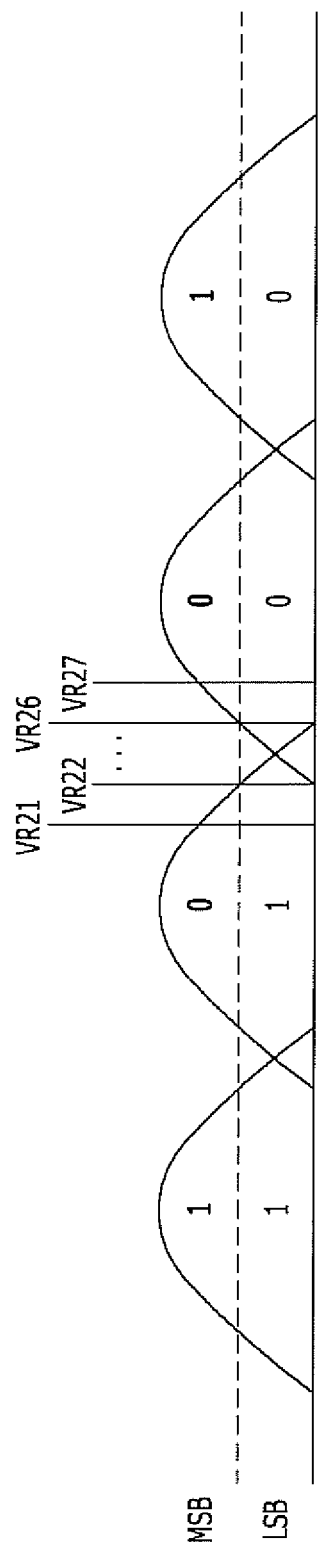
FIG. 1 is a diagram illustrating threshold voltage distributions and determination voltages in accordance with an exemplary embodiment of the present invention, corresponding to the least significant bit data (LSB).

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating threshold voltage distributions and determination voltages in accordance with an exemplary embodiment of the present invention, and it corresponds to the least significant bit data (LSB).

FIG. 1 illustrates threshold voltage distributions corresponding to '11' data, '01' data, '00' data, and '10' data. In order to divide the LSB, an overlapping portion between the '01' data and the '00' data distribution is over-sampled. That is, the overlapping portion between the '01' data and the '00' data is sampled and the threshold voltages of memory cells are sensed based on the sampled overlapping portion, e.g., in response to first to seventh LSB determination voltages VR21 to VR27. Then, as shown in Table 1, the sensed values are encoded into three-bit data.

Each of the codes generated in such a manner serves as information for determining the position of corresponding threshold voltage.

Hereinafter, methods for generating the first LSB position information code INF_LB<1>, the second LSB position information code INF_LB<2>, and the third LSB position information code INF_LB<3> will be described with reference to Tables 2 to 4, respectively.

First, the first LSB position information code INF_LB<1> is obtained by sensing the corresponding threshold voltage distributions based on the fourth LSB determination voltage VR24. As seen from Table 2 below, when the corresponding threshold voltage is smaller than the fourth LSB determination voltage VR24 (refer to FIG. 1), the first LSB position information code INF_LB<1> has a value of '1', and when the corresponding threshold voltage is higher, the first LSB position information code INF_LB<1> has a value of '0'.

TABLE 2

|  | VR24 | | | | | | | |
|---|---|---|---|---|---|---|---|---|
| INF_LB<1> | 1 | 1 | 1 | 1 | 0 | 0 | 0 | 0 |

Next, the second LSB position information code INF_LB<2> is obtained by sensing the corresponding threshold voltage distributions based on the second and sixth LSB determination voltages VR22 and VR26. As seen from Table 3 below, when the corresponding threshold voltage is higher than the second LSB determination voltage VR22 and lower than the sixth LSB determination voltage VR26, the second LSB position information code INF_LB<2> has a value of '0', and otherwise, the second LSB position information code INF_LB<2> has a value of '1'.

TABLE 3

|  | VR22 | | | | VR26 | | | |
|---|---|---|---|---|---|---|---|---|
| INF_LB<2> | 1 | 1 | 0 | 0 | 0 | 0 | 1 | 1 |

Finally, the third LSB position information code INF_LB<3> is obtained by sensing the corresponding threshold voltage distributions based on the first, third, fifth, and seventh LSB determination voltages VR21, VR23, VR25, and VR27. As seen from Table 4 below, the third LSB position information code INF_LB<3> is generated through three operations. First, when the corresponding threshold voltage is higher than the third LSB determination voltage VR23 and lower than the fifth LSB determination voltage VR25, 'VR23/VR25' has a value of '0', and otherwise, 'VR23/VR25' has a value of '1'. Furthermore, when the corresponding threshold voltage is higher than the first determination voltage VR21 and lower than the seventh determination voltage VR27, 'VR21/VR27' has a value of '0', and otherwise, 'VR21/VR27' has a value of '1'.

TABLE 1

|  | VR21 | VR22 | VR23 | VR24 | VR25 | VR26 | VR27 |
|---|---|---|---|---|---|---|---|
| INF_LB<1> | 1 | 1 | 1 | 1 | 0 | 0 | 0 | 0 |
| INF_LB<2> | 1 | 1 | 0 | 0 | 0 | 0 | 1 | 1 |
| INF_LB<3> | 1 | 0 | 0 | 1 | 1 | 0 | 0 | 1 |

Then, the third LSB position information code INF_LB<3> is set by applying an odd parity scheme to 'VR23/VR25' and 'VR21/VR27'.

TABLE 4

|  | VR21 | VR23 | | VR25 | | VR27 |  |
|---|---|---|---|---|---|---|---|
| VR23/VR25 | 1 | 1 | 1 | 0 | 0 | 1 | 1 | 1 |
| VR21/VR27 | 1 | 0 | 0 | 0 | 0 | 0 | 0 | 1 |
| INF_LB<3> | 1 | 0 | 0 | 1 | 1 | 0 | 0 | 1 |

Each of the first to third LSB position information codes INF_LB<1:3> set in such a manner corresponds to information on where the threshold voltage of corresponding data is positioned in the threshold voltage distributions. The semiconductor memory device in accordance with the embodiment of the present invention sequentially transfers the first to third position information codes INF_LB<1:3> to a circuit for error correction operation.

Figure 2:
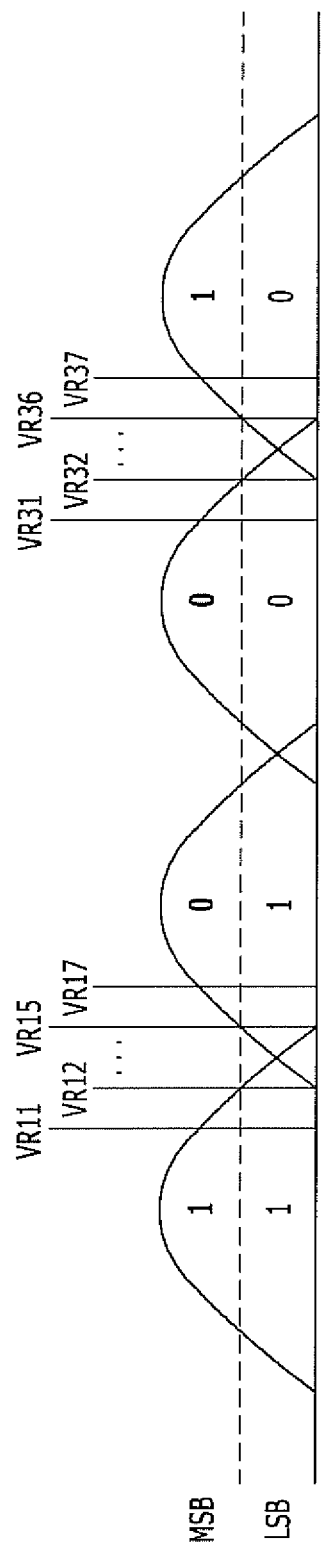
FIG. 2 is a diagram illustrating threshold voltage distributions and determination voltages in accordance with the exemplary embodiment of the present invention, corresponding to the most significant bit data (MSB).

FIG. 2 is a diagram illustrating threshold voltage distributions and determination voltages in accordance with the exemplary embodiment of the present invention, and it corresponds to the most significant bit data (MSB).

FIG. 2 shows threshold voltage distributions corresponding to '11' data, '01' data, '00' data, and '10' data. In order to divide the MSB, an overlapping portion between the '11' data and the '01' data and an overlapping portion between the '00' data and the '10' data are over-sampled. That is, the overlapping portion between the '11' data and the '01' data is sampled and the threshold voltages of memory cells are sensed based on the sampled overlapping portion, e.g., in response to first to seventh MSB determination voltages VR11 to VR17. Furthermore, the overlapping portion between the '00' data and the '10' data is sampled and the threshold voltages of memory cells are sensed based on the sampled overlapping portion, e.g., in response to eighth to 14th MSB determination voltages VR31 to VR37. Then, as shown in Table 5, the sensed values are encoded into three-bit data.

Hereinafter, methods for generating a first MSB position information code INF_MB<1>, a second MSB position information code INF_MB<2>, and a third MSB position information code INF_MB<3> will be described with reference to Tables 6 to 8, respectively. As described below, the first to third MSB position information codes INF_MB<1:3> are generated by a different method from the first to third LSB position information codes INF_LB<1:3>.

First, the first MSB position information code INF_MB<1> is obtained by sensing the corresponding threshold voltage distributions based the fourth MSB determination voltage VR14 between the '11' data and the '01' data and the 11th MSB determination voltage VR34 between the '00' data and the '10' data. As seen from Table 6 below, when the corresponding threshold voltage is higher than the fourth MSB determination voltage VR14 and lower than the 11th MSB determination voltage VR34, the first MSB position information code INF_MB<1> has a value of '0', and when the corresponding threshold voltage is lower than the fourth MSB determination voltage VR14 or higher than the 11th MSB determination voltage VR34, the first MSB position information code INF_MB<1> has a value of '1'.

TABLE 6

|  | VR14 | | | | | | | | | | | | VR34 | | | |
|---|---|---|---|---|---|---|---|---|---|---|---|---|---|---|---|---|
| INF_MB<1> | 1 | 1 | 1 | 1 | 0 | 0 | 0 | 0 | 0 | 0 | 0 | 0 | 1 | 1 | 1 | 1 |

Next, the second MSB position information code INF_MB<2> is obtained by sensing the corresponding threshold voltage distributions based on the second, sixth, ninth, and 13th MSB determination voltages VR12, VR16, VR32, and VR36. As seen from Table 7 below, the second MSB position information code INF_MB<2> is generated through three operations. First, when the corresponding threshold voltage is higher than the sixth MSB determination voltage VR16 and lower than the ninth MSB determination voltage VR32, 'VR16/VR32' has a value of '0', and otherwise, 'VR16/VR32' has a value of '1'. Furthermore, when the corresponding threshold voltage is higher than the second MSB determination voltage VR12 and lower than the 13$^{th}$ MSB determination voltage VR36, 'VR12/VR36' has a value of '0', and otherwise, 'VR16/VR32' has a value of '1'.

TABLE 5

|  | VR11 | VR12 | VR13 | VR14 | VR15 | VS16 | VR17 |
|---|---|---|---|---|---|---|---|
| INF_MB<1> | 1 | 1 | 1 | 1 | 0 | 0 | 0 | 0 |
| INF_MB<2> | 1 | 1 | 0 | 0 | 0 | 0 | 1 | 1 |
| INF_MB<3> | 1 | 0 | 0 | 1 | 1 | 0 | 0 | 1 |

|  | VR31 | VR32 | VR33 | VR34 | VR35 | VR36 | VR37 |
|---|---|---|---|---|---|---|---|
| INF_MB<1> | 0 | 0 | 0 | 0 | 1 | 1 | 1 | 1 |
| INF_MB<2> | 1 | 1 | 0 | 0 | 0 | 0 | 1 | 1 |
| INF_MB<3> | 1 | 0 | 0 | 1 | 1 | 0 | 0 | 1 |

Each of the codes generated in such a manner serves as information for determining the position of corresponding threshold voltage.

Then, the second MSB position information code INF_MB<2> is set by applying the odd parity scheme to 'VR16/VR32' and 'VR16/VR32'.

TABLE 7

| | VR12 | | | | VR16 | | | | VR32 | | | | VR36 | | | |
|---|---|---|---|---|---|---|---|---|---|---|---|---|---|---|---|---|
| VR16/VR32 | 1 | 1 | 1 | 1 | 1 | 1 | 0 | 0 | 0 | 0 | 1 | 1 | 1 | 1 | 1 | 1 |
| VR12/VR36 | 1 | 1 | 0 | 0 | 0 | 0 | 0 | 0 | 0 | 0 | 0 | 0 | 0 | 0 | 1 | 1 |
| INF_MB<2> | 1 | 1 | 0 | 0 | 0 | 0 | 1 | 1 | 1 | 1 | 0 | 0 | 0 | 0 | 1 | 1 |

Finally, the third MSB position information code INF_MB<3> is obtained by sensing the corresponding threshold voltage distributions based on the first, third, fifth, seventh, eight, tenth, 12th, and 14th MSB determination voltages VR11, VR13, VR15, VR17, VR31, VR33, VR35, and VR37. As seen from Table 8 below, the third MSB position information code INF_MB<3> is generated through five operations. First, when the corresponding threshold voltage is higher than the seventh MSB determination voltage VR17 and lower than the eighth MSB determination voltage VR31, 'VR17/VR31' has a value of '0', and otherwise, 'VR17/VR31' has a value of '1'. In this way, VR15/VR33', 'VR13/VR35', and 'VR11/VR37' corresponding to the fifth and tenth MSB determination voltages VR15 and VR33, the third and 12th MSB determination voltages VR13 and vR35, and the first and 14th MSB determination voltages VR11 and VR37, respectively, are decided.

Then, the third MSB position information code INF_MB<3> is set by applying the odd parity scheme to 'VR17/VR31', 'VR15/VR33', 'VR13/VR35', and 'VR11/VR37'.

TABLE 8

| | VR11 | | VR13 | | VR15 | | VR17 | | VR31 | | VR33 | | VR35 | | VR37 | |
|---|---|---|---|---|---|---|---|---|---|---|---|---|---|---|---|---|
| VR17/VR31 | 1 | 1 | 1 | 1 | 1 | 1 | 1 | 0 | 0 | 1 | 1 | 1 | 1 | 1 | 1 | 1 |
| VR15/VR33 | 1 | 1 | 1 | 1 | 1 | 0 | 0 | 0 | 0 | 0 | 0 | 1 | 1 | 1 | 1 | 1 |
| VR13/VR35 | 1 | 1 | 1 | 0 | 0 | 0 | 0 | 0 | 0 | 0 | 0 | 0 | 0 | 1 | 1 | 1 |
| VR11/VR37 | 1 | 0 | 0 | 0 | 0 | 0 | 0 | 0 | 0 | 0 | 0 | 0 | 0 | 0 | 0 | 1 |
| INF_MB<3> | 1 | 0 | 0 | 1 | 1 | 0 | 0 | 1 | 1 | 0 | 0 | 1 | 1 | 0 | 0 | 1 |

Each of the first to third MSB position information codes INF_MB<1:3> set in such a manner corresponds to information on where the threshold voltage of corresponding data is positioned in the threshold voltage distributions. The semiconductor memory device in this embodiment of the present invention sequentially transfers the first to third MSB position information codes INF_MB<1:3> to a circuit for error correction operation.

Although the description has been made of the LSB position information codes and the MSB position information codes including 3-bit code, respectively, the present invention is not limited to this structure. The present invention can be extended to N-bit position information codes.

Figure 3:
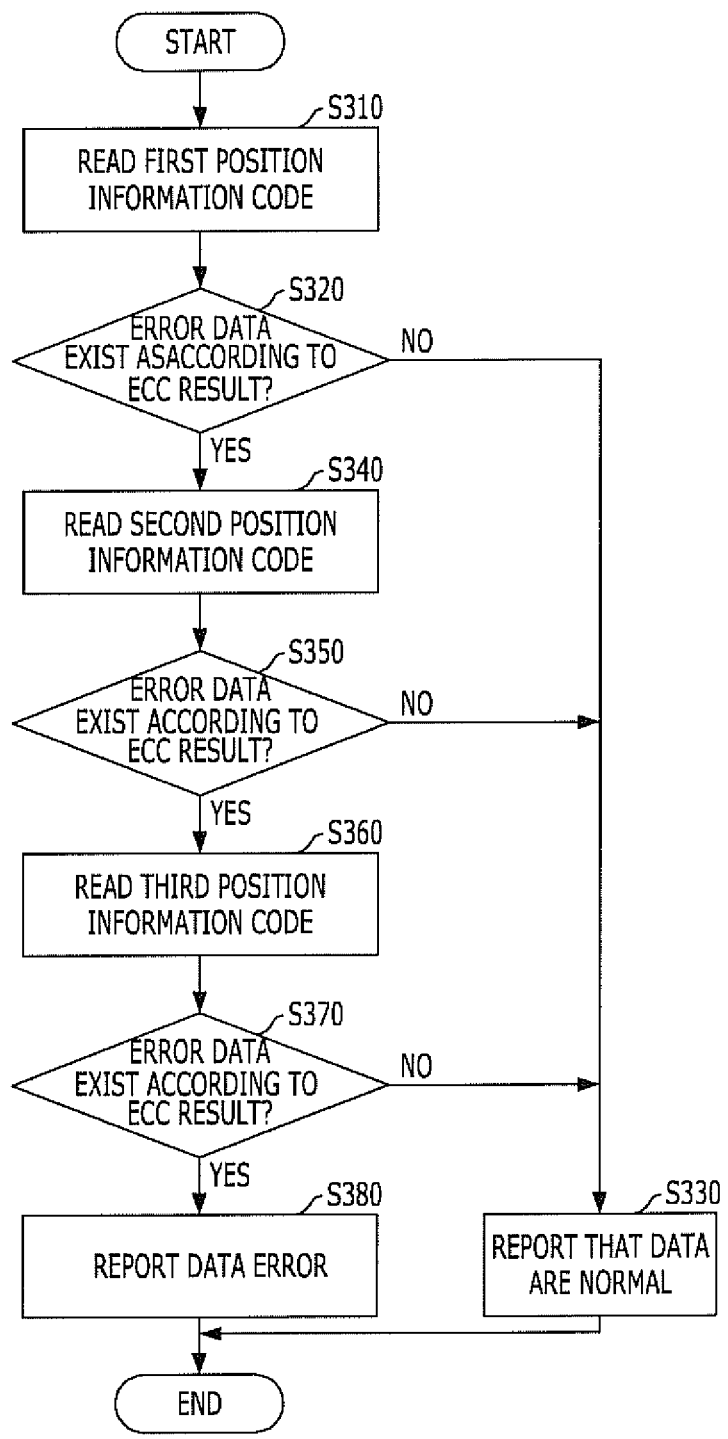
FIG. 3 is a flow chart illustrating a circuit operation of the semiconductor memory device in accordance with the exemplary embodiment of the present invention.

FIG. 3 is a flow chart illustrating a circuit operation of the semiconductor memory device in accordance with the exemplary embodiment of the present invention. The semiconductor memory device in accordance with the exemplary embodiment of the present invention may detect error data through the circuit operation.

Referring to FIG. 3, the error data detection operation of the semiconductor memory device includes reading a first position information code at step S310, determining whether error data exist or not according to an ECC result at step S320, reporting that the read data is normal at step S330, reading a second position information code at step S340, determining whether error data exist or not according to an ECC result at step S350, reading a third position information code at step S360, determining whether error data exist or not according to an ECC result at step S370, and reporting a data error at step S380. Here, ECC represents an error correction operation.

Hereinafter, for the descriptions purposes, the three-bit first to third LSB position information codes INF_LB<1:3> will be shown as an example for describing the error data detection operation of the semiconductor memory device in accordance with the embodiment of the present invention.

At the step S310, the first LSB position information code INF_LB<1> is read. At the step S320, an ECC operation for the first LSB position information code INF_LB<1> is performed to determine whether error data exist or not. As the determination result of the step S320, when the number of error data corresponds to such a level as to be corrected by the ECC operation, information that the read data are normal is transferred to a host or controller, for example, at the step S330. The steps S340 and S350 and the steps S360 and S370 are performed in a similar manner to the steps S310 and S320, and the operations corresponding to the second and third LSB position information codes INF_LB<2:3>, respectively, are performed.

Meanwhile, after the ECC operations corresponding to the first to third LSB position information codes INF_LB<1:3> are performed, an ECC operation may not be performed any more. Therefore, a data error is reported to the host or controller, for example, at the step S380.

The semiconductor memory device in accordance with the embodiment of the present invention converts the positions of threshold voltages into code information, and sequentially transfers the code information to perform an ECC operation, that is, an error correction operation. When it is determined at the step S320 that the number of error data falls within the correction range after the first LSB position information code INF_LB<1> is read at the step S310, information that the read data are normal is transferred at step S330. Therefore, the read operations S340 and S360 and the ECC operations S350 and S370 for the second and third LSB position information codes INF_LS<2:3>, respectively, may not be performed.

Figure 4:
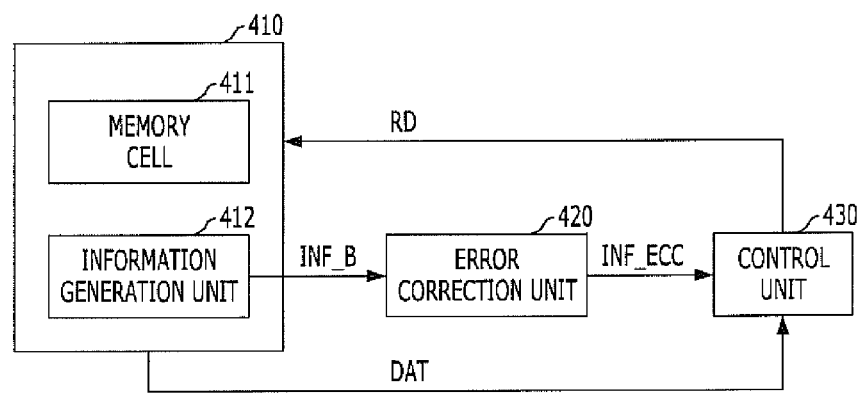
FIG. 4 is a block diagram of a semiconductor memory device system in accordance with the exemplary embodiment of the present invention.

FIG. 4 is a block diagram of a semiconductor memory device system in accordance with the exemplary embodiment of the present invention.

Referring to FIG. 4, the semiconductor memory device system includes a semiconductor memory device 410, an error correction unit 420, and a control unit 430. Here, the error correction unit 420 may be included in the semiconductor memory device 410 or the control unit 430, depending on the different designs.

The semiconductor memory device 410 is configured to sequentially output a plurality of position information codes INF_B corresponding to data stored therein in response to a read command RD inputted from the control unit 430, and it includes a memory cell 411 and an information generation unit 412. Here, the memory cell 411 is configured to store data having given threshold voltage distributions, and the information generation unit 412 is configured to generate the plurality of position information codes INF_B corresponding to given determination voltages in response to the read command RD and sequentially output the generated position information codes INF_B. Here, the read command RD may include a signal for reading the respective position information codes INF_B.

The error correction unit 420 is configured to sequentially receive the plurality of position information codes INF_B transferred from the information generation unit 412 and output an ECC result INF_ECC after an error correction operation. Here, the ECC result INF_ECC may include information on whether the number of error data falls within a correction range or not. The control unit 430 determines whether or not to perform a read operation for the next position information code among the position information codes INF_B, in response to the ECC result INF_ECC. Furthermore, the control unit 430 receives and process data DAT outputted from the semiconductor memory device 410 in response to the ECC result INF_ECC.

For reference, when the given determination voltages are set as a predetermined value, the error correction unit 420 may perform the error correction operation by receiving an offset value regarding the predetermined value from the control unit 430.

As described above, the semiconductor memory device in accordance with the embodiment of the present invention converts the positions of threshold voltages within a given voltage distribution into a plurality of position information codes and performs an error correction operation using the position information codes, thereby maximizing the error correction efficiency.

As the error correction efficiency is maximized, the overall read operations of the semiconductor memory device may be performed more quickly.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   an information generation unit configured to convert positions of threshold voltages of memory cells in threshold voltage distributions based on determination voltages included in an overlapping portion between the threshold voltage distributions to generate a plurality of position information codes; and
   an error correction unit configured to sequentially receive the plurality of position information codes and perform an error correction operation for data of the memory cells.

2. The semiconductor memory device of claim 1, wherein the determination voltages comprise two or more reference voltages between threshold voltages distributions overlapping and corresponding to different least significant bit data or different most significant bit data, among the data of the memory cells.

3. A semiconductor memory system comprising:
   a memory unit configured to convert positions of threshold voltages of memory cells in threshold voltage distributions into a plurality of position information codes in response to determination voltages included in an overlapping portion between the threshold voltage distributions and sequentially output the plurality of position information codes in response to a read command;
   an error correction unit configured to perform an error correction operation on the plurality of position information codes for data of the memory cells; and
   a control unit configured to generate the read command in response to an output signal of the error correction unit.

4. The semiconductor memory device system of claim 3, wherein the control unit receives and processes the data of the memory cells outputted from the memory unit.

5. The semiconductor memory device system of claim 3, wherein the determination voltages comprise two or more reference voltages between threshold voltages distributions overlapping and corresponding to different least significant bit data or different most significant bit data, among the data of the memory cells.

6. An operating method of a semiconductor memory device, comprising:
   setting a plurality of determination voltages in an overlapping portion between threshold voltage distributions;
   converting a position of a threshold voltage of a memory cell in the threshold voltage distributions into a plurality of position information codes based on the plurality of determination voltages;
   performing an error correction operation on one position information code among the plurality of position information codes, in response to a read command; and
   detecting whether data of the memory cell is normal or not, depending on a result from the performing of the error correction operation.

7. The operating method of claim 6, further comprising:
   generating a next read command depending on a result from the detecting of whether the data is normal or not; and
   performing an error correction operation on the other position information codes among the plurality of position information codes, in response to the next read command.

8. An operating method of a semiconductor memory device, comprising:
   setting first to third determination voltages in an overlapping portion between threshold voltage distributions, wherein the first to third determination voltages are in order from the lowest to the highest;
   determining a position of a threshold voltage of a memory cell in the threshold voltage distributions based on the second determination voltage to generate a first position information code;
   determining the position of the threshold voltage based on the first and third determination voltages to generate a second position information code; and
   sequentially receiving the first and second position information codes to perform an error correction operation for data of the memory cell.

9. The operating method of claim 8, wherein the determining of the position of the threshold voltage based on the second determination voltage comprises:
   determining whether the threshold voltage is lower or higher than the second determination voltage.

10. The operating method of claim 8, wherein the determining of the position of the threshold voltage based on the first and third determination voltages comprises:
   determining whether the threshold voltage is between the first and third determination voltages or not.

11. The semiconductor memory device of claim 8, wherein the first to third determination voltages are set in an overlapping portion between threshold voltages distributions overlapping and corresponding to different least significant bit data or different most significant bit data, among the data of the memory cells.

* * * * *